(12) United States Patent
Mejri et al.

(10) Patent No.: US 10,511,461 B2
(45) Date of Patent: Dec. 17, 2019

(54) SEQUENTIAL DECODING WITH STACK REORDERING

(71) Applicant: INSTITUT MINES-TELECOM, Paris (FR)

(72) Inventors: Asma Mejri, Antibes (FR); Ghaya Rekaya-Ben Othman, Antony (FR)

(73) Assignee: INSTITUT MINES-TELECOM, Paris (FR)

( * ) Notice: Subject to any disclaimer, the term of this patent is extended or adjusted under 35 U.S.C. 154(b) by 69 days.

(21) Appl. No.: 15/580,141

(22) PCT Filed: Jun. 7, 2016

(86) PCT No.: PCT/EP2016/062915
§ 371 (c)(1),
(2) Date: Dec. 6, 2017

(87) PCT Pub. No.: WO2016/198410
PCT Pub. Date: Dec. 15, 2016

(65) Prior Publication Data
US 2018/0145852 A1   May 24, 2018

(30) Foreign Application Priority Data
Jun. 12, 2015   (EP) ..................................... 15305910

(51) Int. Cl.
*H04L 25/03* (2006.01)
*H03M 13/39* (2006.01)
*H03M 13/00* (2006.01)

(52) U.S. Cl.
CPC .. *H04L 25/03197* (2013.01); *H03M 13/3977* (2013.01); *H03M 13/6505* (2013.01);
(Continued)

(58) Field of Classification Search
CPC ......... H04L 25/03197; H04L 25/03203; H04L 25/03242; H04L 25/0321; H04L 25/03891;
(Continued)

(56) References Cited

U.S. PATENT DOCUMENTS

2010/0157785 A1   6/2010   Song et al.
2012/0263261 A1   10/2012  Gestner et al.

FOREIGN PATENT DOCUMENTS

EP            3001625 A1      3/2016

OTHER PUBLICATIONS

International Search Report and Written Opinion for PCT/EP2016/062915 dated Sep. 16, 2016.
(Continued)

*Primary Examiner* — Michael R Neff
(74) *Attorney, Agent, or Firm* — Meagher Emanuel Laks Goldberg & Liao, LLP

(57) ABSTRACT

There is provided a decoder (310) for sequentially decoding a data signal received through a transmission channel in a communication system, the received data signal carrying transmitted symbols, the decoder comprising a symbol estimation unit (311) configured to determine estimated symbols representative of the transmitted symbols carried by the received signal from information stored in a stack, the stack being filled by iteratively expanding child nodes of a selected node of a decoding tree comprising a plurality of nodes, each node of the decoding tree corresponding to a candidate component of a symbol of the received data signal and each node being associated with a predetermined metric, the stack being filled at each iteration with at least some of the expanded child nodes and being ordered by increasing values of the metrics associated with the nodes, the selected node for each iteration corresponding to the node having the
(Continued)

lowest metric in the stack. The decoder further comprises a stack reordering activation monitoring unit (313) configured to monitor at least one stack reordering activation condition and, in response to a stack reordering activation condition being verified, to cause the symbol estimation unit to:

reduce the metric associated with each node stored in the stack by a quantity, reorder the stack by increasing value of the reduced metric, and remove a set of nodes from the reordered stack so as to maintain a number N of nodes in the reordered stack, the maintained nodes corresponding to the N nodes having the lowest metrics in the reordered stack.

18 Claims, 6 Drawing Sheets

(52) U.S. Cl.
CPC .... *H04L 25/0321* (2013.01); *H04L 25/03203* (2013.01); *H04L 25/03242* (2013.01); *H04L 25/03891* (2013.01); *H04L 2025/03426* (2013.01)

(58) Field of Classification Search
CPC .... H04L 2025/03426; H03M 13/3977; H03M 13/6505
USPC ........................................................ 375/316
See application file for complete search history.

(56) References Cited

OTHER PUBLICATIONS

Park C S et al: "Probabilistic Spherical Detection and VLSI Implementation for Multiple-Antenna Systems", IEEE Transactions on Circuits and Systems I: Regular Papers, IEEE, US, vol. 56, No. 3, Mar. 1, 2009 (Mar. 1, 2009), pp. 685-698.

Burg A et al: "Advanced Receiver Algorithms for MIMO Wireless Communications", Design, Automation and Test in Europe, 2006. DATE '06. Proceedings Munich, Germany Mar. 6-10, 2006, Piscataway, NJ, USA,IEEE, vol. 1, Mar. 6, 2006 (Mar. 6, 2006), pp. 1-6.

E. Viterbo and J. Boutros: "A universal lattice code decoder for fading channels", IEEE Transactions on Information Theory, vol. 45 No. 5, pp. 1639-1642, Jul. 1999.

C. P. Schnorr and M. Euchner: "Lattice basis reduction: Improved practical algorithms and solving subset sum problems", In Math. Programming, pp. 181-191, 1993.

A.R. Murugan, H. El-Gamal, M.-O. Damen, and G. Caire. A unified framework for tree search decoding: Rediscovering the sequential decoder. IEEE Transactions on Information Theory, vol. 52, No. 3, pp. 933-953, Mar. 2006.

F. Jelinek: "Fast sequential decoding algorithm using a stack", IBM, J. Res. Dev., vol. 13, No. 6, pp. 675-685, Nov. 1969.

R. Fano: "A heuristic discussion of probabilistic decoding", IEEE Transactions on Information Theory, vol. 9, No. 2, pp. 64-74, Apr. 1963.

G.R. Ben-Othman, et al.,: "The Spherical Bound Stack Decoder", In Proceedings of International Conference on Wireless and Mobile Computing, pp. 322-327, Oct. 2008.

J. C. Belfiore, et al: "The Golden Code: A 2=2 Full-Rate Space-Time Code with Non-Vanishing Determinants", IEEE Transactions on Information Theory, vol. 51, No. 4, pp. 1432-1436, Apr. 2005.

SEQUENTIAL DECODING WITH STACK REORDERING

BACKGROUND

The invention generally relates to digital communication and in particular to methods, systems, and computer program products for sequentially decoding a received data signal.

With the spectacular evolution of electronic devices and the emergence of computing technologies, wireless networks are becoming essential components of all modern modes of communications. The deployment of such communication systems comes with the challenge of meeting a number of constraints related, on the one hand, to the scarcity of physical resources, such as bandwidth and, on the other hand, to hardware complexity costs required to implement the coding operations and decoding algorithms necessary to support the quality of service requirements.

Different wireless communication systems are available today, such as the cellular and wireless ad-hoc networks accommodating single or multiple transmitters/receivers using single or multiple antennas, such as MIMO (Multiple INPUT Multiple OUTPUT) systems.

In addition to low-power consumption and memory requirements imposed by the system devices, a major challenge of such communication systems is the complexity cost. In order to warrant the deployment for real-time and high-throughput applications, it is desirable that the coding operations and decoding algorithms satisfy the prescribed computational complexity which is fixed for a given device and application.

Decoding methods such as "Maximum Likelihood" decoding (also called "ML" decoding) are known to decode a digital stream in any transmission scheme. Such decoding methods provide an estimation of the closest vector to the observed received signal under the minimization of a Euclidean distance criterion. Such ML decoding techniques use an exhaustive search and provide optimal performance. However, they require a high complexity that increases as the size of the constellation codebook or the number of the transmit antennas becomes higher, thereby making the implementation of such techniques impossible in practical systems.

Other decoding techniques have been proposed to properly decode the received signal while considering the decoder complexity, such as the Sphere Decoder (E. Viterbo and J. Boutros. A universal lattice code decoder for fading channels. IEEE Transactions on Information Theory, 45(5): 1639-1642, July 1999) or the Schnorr-Euchner decoder (C. P. Schnorr and M. Euchner. Lattice basis reduction: Improved practical algorithms and solving subset sum problems. In Math. Programming, pages 181-191, 1993). A main drawback of these decoders is their increasing complexity when the constellation size or the number of antennas increases. Other suboptimal low-complexity decoders, such as the ZF, the ZF-DFE and the MMSE are implemented in practical systems but present limited computational capabilities.

Other decoding algorithms applicable in linear communication systems, using single or multiple users and/or antennas, include the lattice sequential decoders which are of great interest. Lattice sequential decoding techniques (also known as "stack" decoding techniques) implement the optimal ML detection criterion using a tree representation of the ML optimization problem (decoding tree) and a tree search, which results in a reduced complexity with respect to the exhaustive search approach. In the decoding tree, each path from the root node to a leaf node is a possible transmitted signal. Nodes in the decoding tree correspond to different values taken by the decoded symbols and each path from the root node to a leaf node is a possible transmitted signal.

According to the search strategy implemented by sequential decoders, the expanded tree nodes are stored in a global stack. In the global stack, the tree nodes expanded during the decoding process are stored and sorted according to an increasing order of their decoding metrics.

Sequential decoders include decoders implementing a Best-First tree search such as the Stack decoder as disclosed in:

A. R. Murugan, H. El-Gamal, M.-O. Damen, and G. Caire. A unified framework for tree search decoding: Rediscovering the sequential decoder. *IEEE Transactions on Information Theory*, 52(3):933-953, March 2006;

F. Jelinek. Fast sequential decoding algorithm using a stack. *IBM J. Res. Dev.*, 13(6):675-685, November 1969.

Another type of lattice sequential decoding method using a Best-First tree search is known as the Fano decoding method as disclosed in R. Fano. A heuristic discussion of probabilistic decoding. *IEEE Transactions on Information Theory*, 9(2):64-74, April 1963).

Sequential decoders improve the overall decoding complexity. However, for an increasing constellation size and a high number of antennas, the stack decoding technique requires a high computational complexity. In order to reduce this complexity, another decoding technique referred to as the Spherical-Bound Stack decoder (SB-Stack) has been proposed in the article by G. R. Ben-Othman, R. Ouertani, and A. Salah, entitled "The Spherical Bound Stack Decoder", In Proceedings of International Conference on Wireless and Mobile Computing, pages 322-327, October 2008. The SB-stack approach combines the Stack search strategy with the Sphere Decoder search region: the decoder searches for the closest vector inside a sphere centered at the received point implementing the stack decoding strategy. The spherical search region imposes a search interval for each detected symbol. Only nodes belonging to these intervals at each tree level are visited and expanded.

Lattice sequential decoders have strongly imposed themselves as optimal detection schemes in linear wireless communication systems reducing the optimal ML decoding problem to the search for the path in a graph-tree having the least weight metric. However, in presence of a large constellation size (equivalently a large number of nodes in each tree level) and/or high dimensional-decoding tree, the number of the visited nodes during the tree-search phase, and thus the size of the stack storing these nodes, increases and may exceed the available stack size imposed by the hardware requirements for a given target application and given devices. The stack size may also be exceeded when the communication channel is bad requiring a slowest convergence time and longer decoding process for visiting a high number of tree-nodes until finding the desired estimation of the original information symbols.

Such rapid growth of the stack size in presence of high-dimensional constellations and/or tree-levels, as well as the resulting complexity in finding the optimal path in the graph, are of significant impediments to the implementation of the lattice sequential algorithms for real-time and high-throughput applications constrained by limited physical resources (such as a limited stack size imposed by the hardware requirements).

Accordingly, improved sequential decoding systems, methods, and computer program products are needed that enable stack management.

SUMMARY

In order to address these and other problems, there is provided a decoder for sequentially decoding a data signal received through a transmission channel in a communication system, the received data signal carrying transmitted symbols, the decoder comprising a symbol estimation unit configured to determine estimated symbols representative of the transmitted symbols carried by the received signal from information stored in a stack, the stack being filled by iteratively expanding child nodes of a selected node of a decoding tree comprising a plurality of nodes, each node of the decoding tree corresponding to a candidate component of a symbol of the received data signal and each node being associated with a predetermined metric, the stack being filled at each iteration with at least some of the expanded child nodes and being ordered by increasing values of the metrics associated with the nodes, the selected node for each iteration corresponding to the node having the lowest metric in the stack. The decoder further comprises a stack reordering activation monitoring unit configured to monitor at least one stack reordering activation condition and, in response to a stack reordering activation condition being verified, to cause the symbol estimation unit to:

reduce the metric associated with each node stored in the stack by a quantity, reorder the stack by increasing value of the reduced metric, and remove a set of nodes from the reordered stack so as to maintain a number N of nodes in the reordered stack, the maintained nodes corresponding to the N nodes having the lowest metrics in the reordered stack.

The symbol estimation unit may be configured to order and reorder the stack by placing the node having the lowest metric at the top of the stack, the nodes removed from the stack corresponding to the nodes located in the bottom part of the reordered stack and the nodes being maintained in the reordered stack correspond to the number of nodes located in the top part of the reordered stack.

The symbol estimation unit may be configured to determine the metric associated with a given node of the decoding tree as a function of the Euclidean distance between the signal received and the path between the root node of the decoding tree and the node.

In certain embodiments, the at least one stack reordering activation condition may comprise a termination condition for triggering an early termination of the decoding method.

The termination condition may comprise one condition related to the current computational complexity of the decoding method.

The symbol estimation unit may be configured to only maintain one node corresponding to the node having the lowest metric in the reordered stack.

In one embodiment, in response to the reordering of the stack, the symbol estimation unit may be configured to only store in the stack one node corresponding to the node among the expanded child nodes having the lowest respective metric, in each subsequent iteration.

In another embodiment, the at least one stack reordering activation condition may comprise a stack size related condition related to the number of nodes stored in the stack with respect to the maximal size of the stack.

The stack size related condition may be verified if the number of nodes stored in the stack exceeds a quantity equal to the difference between the maximal size ($K_{max}$) of the stack and a predefined positive valued parameter (p).

The number of nodes maintained in the reordered stack may be a function of the difference between the maximal size ($K_{max}$) of the stack and the predefined positive valued parameter (p).

The quantity ($G_{s_k}$) applied to reduce a metric associated with a given node stored in the stack may be a function (g(k)) of the level (k) of the node ($s_k$) in the decoding tree.

The function (g(k)) applied to a metric associated with a given node stored in the stack may be a polynomial function of the level (k) of the node ($s_k$) in the decoding tree.

The function (g(k)) applied to a metric associated with a given node stored in the stack may be a linear function having predefined slope and intercept coefficients.

In particular, the intercept coefficient may be null and the slope coefficient may be a positive value coefficient determined from the noise level.

There is also provided a receiver for receiving and decoding an encoded data signal, the receiver comprising a decoder according to any of the previous embodiments for decoding the data signal.

There is further provided a wireless (mobile or fixed) device capable of transmitting and receiving data in a wireless communication network, wherein the wireless device comprises the previous receiver for receiving a data signal.

The invention further provides a method of sequentially decoding a data signal received through a transmission channel in a communication system, the received data signal carrying transmitted symbols, the method comprising determining estimated symbols representative of the transmitted symbols carried by the received signal from information stored in a stack, the stack being filled by iteratively expanding the child nodes of a selected node of a decoding tree comprising a plurality of nodes, each node of the decoding tree corresponding to a candidate component of a symbol of the received data signal and each node being associated with a predetermined respective metric, the stack being filled at each iteration with at least some of the expanded child nodes and being ordered by increasing values of the metrics associated with the nodes, the selected node for each iteration corresponding to the node having the lowest metric in the stack. The method further comprises monitoring at least one stack reordering activation condition and, in response to a stack reordering activation condition being verified:

reducing the metric associated with each node stored in the stack by a quantity, reordering the stack by increasing value of the reduced metric, and removing a set of nodes from the reordered stack so as to maintain a number of nodes in the reordered stack, the maintained nodes corresponding to the nodes having the lowest metrics in the reordered stack.

Additionally, there is provided a computer program product for sequentially decoding a data signal received through a transmission channel in a communication system, the received data signal carrying transmitted symbols, the estimated symbols being determined from nodes of a decoding tree based on a weight metric associated with each of the node, the computer program product comprising:

a non-transitory computer readable storage medium; and instructions stored on the non-transitory computer readable storage medium that, when executed by a processor, cause the processor to determine estimated symbols representative of the transmitted symbols carried by the received signal from information stored in a stack, the stack being filled by iteratively expanding the child nodes of a selected node of a decoding tree comprising a plurality of nodes, each node of the decoding tree corresponding to a candidate component of a symbol of the received data signal and each node being associated with a predetermined respective metric, the stack being filled at each iteration with at least some of the expanded child nodes and being ordered by increasing values of the metrics associated with the nodes, the selected node for each iteration corresponding to the node having the lowest metric in the stack. The processor is further caused to monitor at least one stack reordering activation condition and, in response to a stack reordering activation condition being verified:

to reduce the metric associated with each node stored in the stack by a quantity,
  to reorder the stack by increasing value of the reduced metric, and
  to remove a set of nodes from the reordered stack so as to maintain a number of nodes in the reordered stack, the maintained nodes corresponding to the nodes having the lowest metrics in the reordered stack.

The various embodiments of the invention allow for managing the stack in an efficient way, thereby resulting in an improved operation of the decoder with respect to the prescribed computational complexity and the available hardware resources. In particular, with the stack reordering method according to the various embodiments of the invention, the stack filling may be adapted to the available resources known at any transceiver, and to the desired convergence time and/or decoding complexity.

Further advantages of the present invention will become clear to the skilled person upon examination of the drawings and detailed description. It is intended that any additional advantages be incorporated herein.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Figure 1:
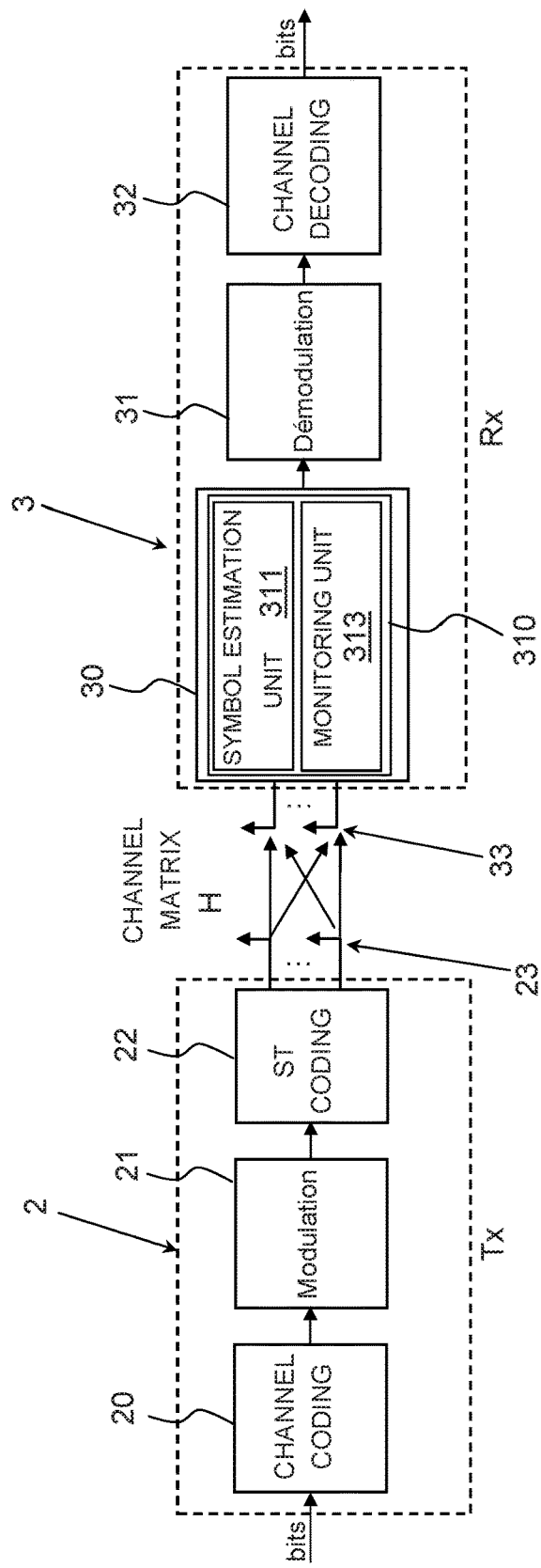
FIG. 1 schematically represents an exemplary communication system implementing the decoding method.

Embodiments of the invention provide methods and apparatuses for sequential decoding of a data signal received over a communication channel that optimizes the size of the stack used to store the candidate lattice points. The sequential decoding method recursively expands the nodes of a decoding tree comprising a plurality of nodes representing possible components of a symbol of the received data signal, and stores a selected set of the expanded nodes in a stack, each node being stored in the stack in association with a respective metric (also referred to as a "weight metric", a "cost" or a "weight"). The metric of a node represents, for the data signal being considered, a probability defined by a numerical value.

According to one aspect of the invention, there is provided a stack reordering method which may be triggered during the decoder's operation. Each iteration of the stack reordering method subtracts a selected quantity $G_{s_k}$ (also referred to hereinafter as a "metric reduction quantity") from at least some of the metrics associated with the nodes $s_k$ stored in the current stack. As a result, the nodes with high levels k (hence localized near to leaf nodes) are favored. The current stack is then reordered and the nodes the most advanced in the tree reach the top of the stack. Depending on the application of the invention, the decoder may proceed with new iterations of the sequential decoding based on the reordered stack. In each iteration of the decoding steps which is subsequent to a reordering of the stack, the metric may be computed conventionally without metric reduction. However, in certain embodiments, each subsequent iteration may be performed so as to maintain only the lowest metric node in the stack.

The stack reordering method may be executed once or iterated several times depending on the application of the invention.

The filling of the stack is accordingly managed and adapted to the required decoding complexity and convergence time. For example, when it is needed to accelerate the decoding process, the metric reduction quantity $G_{s_k}$ may be defined so as to make the nodes the most advanced in the tree have the smallest metrics and reach faster the top of the stack enabling a fast convergence of the decoding method. The metric reduction quantity $G_{s_k}$ applied to reduce the metrics of the nodes $s_k$ stored in the stack may be different for each node $s_k$. The metric reduction quantity $G_{s_k}$ may depend on one or more parameters such as parameters related to the node $s_k$ corresponding to the metric to which the quantity $G_{s_k}$ is applied.

The stack reordering method may be applied to reorder the stack during the decoding of the received signal, for example in response to the activation of a termination alarm requiring the termination of the decoder. In such embodiments, the stack reordering method enables an early termination of the decoder by favoring the most advanced nodes.

Alternatively, the invention may be applied to manage the size of the stack and prevent the stack from reaching a critical size. In such application of the invention, the stack reordering method may be applied several times during the decoding process.

As used herein, the decoding tree (also referred to as "search tree" or "logic tree") is a decoding tree data structure representing constellation points of the received signal corresponding to a constellation such as a 2q QAM. The search tree comprises a plurality of nodes, each node comprises an integer value representing a component of a symbol of the received data signal (the received data signal may be represented according to a real-valued representation). In the following description, the term "node" or "node value" will be similarly used to designate a component of a symbol of the received data signal. The first node of the tree is referred to as the root node. A node that does not have any child node (a child node is also referred to as "successor") is referred to as a "leaf" node and corresponds to the lowest level in the tree. Each node has at most one parent node located above it in the tree. The root node being the highest node in the tree, it does not have any parent node. The depth (or dimension) of a given node designates the length of the path from this given node up to the root node of the decoding tree. All the nodes of the decoding tree can be reached from the root node. Each path from the root node to a leaf node thus represents a possible transmitted signal. Nodes in the decoding tree represent the different possible values of the symbols $s_i$, where $s_i$, with i representing an integer ranging from n to 1, represent the real and imaginary components of the transmitted information vector. A leaf node designates a node in depth n. According to the notations used herein, the child nodes of a node $s_k$ are designated by the components $s_{k-1}$ and a path of depth i in the tree is designated by the vector $s^{(i)}=(s_n, s_{n-1}, \ldots s_i)$ of length (n−i+1).

A sequential decoding algorithm is a tree-search based decoding algorithm which is based on a tree representation of the ML optimization problem (represented by the decoding tree) and on a tree search according to a Best-First strategy. Such sequential decoding algorithm uses a stack or a list to store the best candidate lattice points (the following description will be made with reference to a "stack" for illustrative purpose although equivalent data structures may be used.

Sequential decoding techniques take into account a metric determined for each expanded node of the decoding tree. Each node selected among the expanded nodes (component of a candidate lattice point) is stored in the stack in association with the computed metric. The metric is generally determined as a function of the Euclidean distance between the signal received and the symbols vector represented by the path between the root node and the current node.

The present invention may be implemented in a wireless communication system for detecting lattice vectors. The communication system comprises at least a transmitter for transmitting simultaneously a plurality of information symbols through a communication channel, and at least a receiver for receiving one or more of the information symbols transmitted by the transmitter in the form of independent signals.

An embodiment of the invention may be integrated in a receiver, for example for the decoding of data transmitted in a MIMO (Multiple Input Multiple Output) channel or for the detection of multiple users.

The present invention may be implemented in a wireless communication system for detecting information points. The communication system comprises at least a transmitter for transmitting simultaneously a plurality of information symbols through a communication channel, and at least a receiver for receiving one or more of the symbols transmitted by the transmitter(s) in the form of independent signals. The communication channel may be any linear AWGN (Additive White Gaussian Noise) channel or a multipath channel. The communication system may use any multiple access technique such as Time Division Multiple Access, Frequency Division Multiple Access, Code Division Multiple Access, and Space Division Multiple Access. In addition, the communication system may use single-carrier or multi-carrier modulation formats such as OFDM (Orthogonal Frequency-Division Multiplexing) or FBMC (Filter Bank Multi-Carrier).

An embodiment of the invention can be integrated in a receiver, for example for the decoding of data transmitted in a MIMO (Multiple Input Multiple Output) channel, according to any MIMO configuration, or for the detection of multiple users.

When applied to MIMO decoding, for a single user or multiple users detection, the dimension of the received signal or channel output depends on the dimension of the signal space at the transmitter, on the number $(n_t)$ of the Transmit (Tx) antennas and/or on the number $(n_r)$ of Receive (Rx) antennas.

The wireless network environment may comprise a plurality of base stations (also referred to as "nodes" or "access points" or "cells" depending on the application context of the invention), each base station including a transmitter and a receiver including one or more antennas. Each station may communicate with other stations through a wireless connection.

Figure 2:
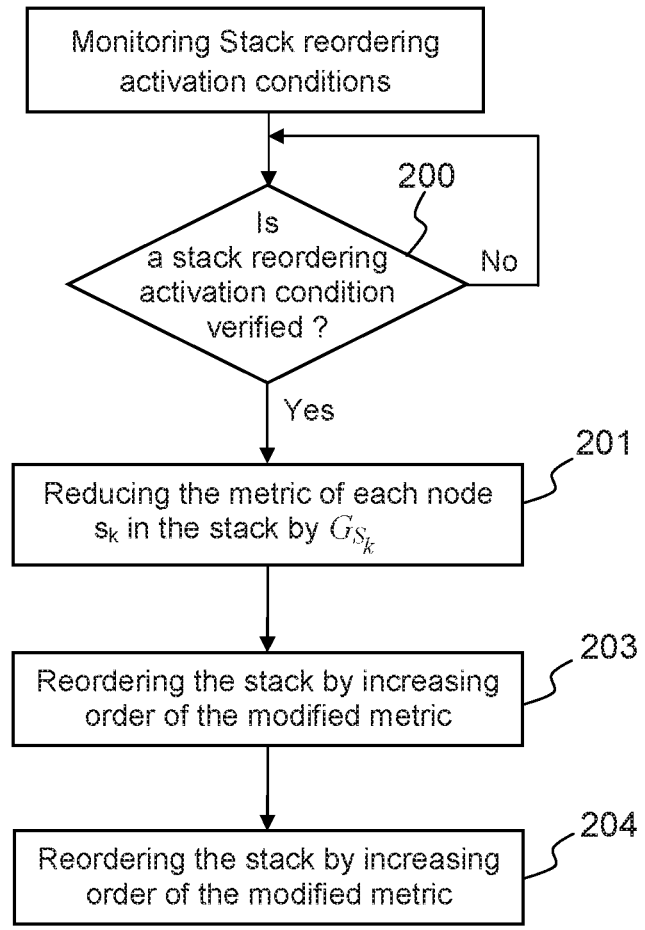
FIG. 2 is a flowchart depicting the stack reordering method according to certain embodiments.

Referring to FIG. 2, an exemplary wireless communication system 100 between a transmitter and a receiver in which a MIMO transmission is used, implementing an STBC (Space Time Block Code) code in transmission to distribute the symbols modulated over various degrees of freedom of the channel. Each transmitter 2 of a station may exchange data with a receiver 3 of another station according to the wireless communication system. The wireless network 100 may rely on a centralized architecture (a controller is provided to control the operation of the base stations) or a decentralized architecture (the base stations may communicate directly with one another). User Terminals (such as wireless devices, cellular phones, personal digital assistants, etc.), may communicate with one or more base stations on the forward link or on the reverse links. The user terminals may be fixed or mobile.

The MIMO configuration may be symmetric, in which case it includes a same number $(n_t)$ of Transmit antennas as the number $(n_r)$ of Receive antennas. Alternatively, the MIMO configuration may be asymmetric, in which case the number $(n_t)$ of Transmit antennas is different from the number $(n_r)$ of Receive antennas (in particular the number $n_r$, at the receive side, is higher than $n_t$, at the transmit side to avoid a rank deficiency).

The transmitter 2 can transmit a signal to a receiver 3 by means of a noisy MIMO channel. The data transmitter 2 can in particular be integrated in the base stations. The transmitter 2 may comprise for example:
 a channel coder 20 for providing convolutional codes,
 a modulator 21 such as a QAM modulator for delivering symbols;
 a space/time coder 22 for delivering a code word;
 $n_t$ transmission antennas 23, each transmission antenna being associated with an OFDM modulator.

The transmitter 2 codes a binary signal received as input using a convolutional code provided by the channel coder 20. The signal is then modulated by the modulator 21 according to a modulation scheme (for example, a quadrature amplitude modulation nQAM). The modulator 21 can also implement a modulation scheme generating complex symbols, each complex symbol belonging to a group of symbols $s_i$. The modulated symbols thus obtained are then coded by the space-time coder 22 to form a code word STBC, such as the Golden Code ("The Golden Code: A 2×2 Full-Rate Space-Time Code with Non-Vanishing Determinants", J.-C. Belfiore, G. Rekaya, E. Viterbo, IEEE Transactions on Information Theory, vol. 51, no. 4, pages 1432-1436, April 2005). The STBC code may be based on a complex matrix of dimension $n_t*T$, in which $n_t$ designates the number of transmission antennas and T is the time length of the STBC code, or on a spatial multiplexing (the modulated symbols are directly sent to the transmission antennas).

The codeword thus generated is converted from the time domain to the frequency domain and distributed over the $n_t$ transmission antennas. Each dedicated signal is then modulated by a respective OFDM modulator, and transmitted over the corresponding transmission antenna 23, optionally after filtering, frequency transposition and amplification.

The receiver 3 can be also integrated in the base stations. The receiver 3 may be configured to receive a signal y transmitted by the transmitter 2 in a wireless channel. The channel may be noisy (for example channel with Additive White Gaussian Noise (AWGN) subjected to fading). The signal transmitted by the transmitter 2 may be further affected by echoes due to the multiple paths and/or the Doppler effect due to the transmitter and receiver having a non-zero relative velocity.

In one exemplary embodiment, the receiver 3 may comprise:
- $n_r$ receiving antennas 33 for receiving the signal y, each receiving antenna being associated with a respective OFDM demodulator; the OFDM demodulators ($n_r$ demodulators) are configured to demodulate the received signal observed at each receiving antenna and delivering demodulated signals. A frequency/time converter may be used to perform a reverse operation of the time/frequency conversion implemented in transmission, and to deliver a signal in the frequency domain;
- a space/time decoder 30 configured to deliver a decoded signal;
- a demodulator 31 configured to perform a demodulation associated with a decoding.

The Space Time decoder 30 may comprise an initial estimation unit such as a sub-optimal decoder 300 (which may be a linear or non-linear decoder) for providing an initial estimation of the transmitted signal (also referred to as a "sub-optimal signal estimation") from the received signal using a sub-optimal detection technique such as a ZF-DFE technique. The Space Time decoder 30 further comprises a tree-search based decoder 310 according to the embodiments of the invention which is configured to use the initial estimate of the original signal (e.g. ZF-DFE estimate), provided by the signal initial estimation unit, to decode the received signal. The decoder 310 comprises a symbol estimation unit 311 configured to determine estimated symbols representative of the transmitted symbols carried by the received signal from information stored in a stack, and a stack reordering activation monitoring unit 313 configured to monitor at least one stack reordering activation condition to trigger reordering of the stack.

It should be noted that the receiver 3 implements a reverse processing of the processing implemented in transmission. Accordingly, if a single-carrier modulation is implemented in transmission instead of a multi-carrier modulation, the $n_r$ OFDM demodulators are replaced by corresponding single-carrier demodulators.

The skilled person will readily understand that the various embodiments of the invention are not limited to specific applications. Exemplary applications of this new decoder include, with no limitation, multi-user communication systems, MIMO decoding in configurations implementable in wireless standards such as the WiFi (IEEE 802.11n), the cellular WiMax (IEEE 802.16e), the cooperative WiMax (IEEE 802.16j), the Long Term Evolution (LTE), the LTE-advanced, the 5G ongoing standardization, and optical communications.

In one application of the invention to a multi-antenna system to decode a signal received by the multi-antenna system (MIMO), with $n_t$ transmit and $n_r$ receive antennas using spatial multiplexing, the data signal $y_c$ received as a complex-valued vector is equal to:

$$y_c = H_c s_c + w_c \quad (1)$$

In Equation (1), $H_c$, $s_c$, and $w_c$ designate respectively the complex value of the channel matrix H, the vector s representing the transmitted data signal and the noise vector w. The received signal $y_c$ may be then transformed into a real-valued representation, for example according to equation (2):

$$y = \begin{bmatrix} \mathcal{R}(H_c) & -\mathcal{J}(H_c) \\ \mathcal{J}(H_c) & \mathcal{R}(H_c) \end{bmatrix} \begin{bmatrix} \mathcal{R}(s_c) \\ \mathcal{J}(s_c) \end{bmatrix} + \begin{bmatrix} \mathcal{R}(w_c) \\ \mathcal{J}(w_c) \end{bmatrix} \quad (2)$$

In equation (2), $\mathcal{R}(.)$ and $\mathcal{J}(.)$ denote respectively the real and imaginary parts of a complex-valued vector.

The equivalent channel output can then be written as:

$$y = Hs + w \quad (3)$$

In embodiments where a length-T Space-Time code is used, the channel output can be written in the same form of equation (1) with the equivalent channel matrix $H_{eq}$ given by:

$$H_{eq} = H_c \Phi \quad (4)$$

In equation (4), $\Phi \in \mathbb{C}^{n_t T \times n_t T}$ corresponds to the coding matrix of the underlying code. For ease of presentation and given that both uncoded and coded schemes result in a same real-valued lattice representation, the following description will be made with reference to the spatial multiplexing and symmetric case with $n_t = n_r$ and $n = 2n_r$.

According to the equivalent system obtained in (3), the received signal can be viewed as a point of the lattice generated by H and perturbed by the noise vector w.

When perfect detection is required, the receiver implements an ML decoder that attempts to determine, given the channel output and the channel matrix, an estimate $\hat{s}$ of the originally transmitted symbols vector from the given data in H and y, according to the minimization of the error probability such that:

$$\hat{s} = \text{argmin}_{s_c \in A} P_r(\hat{s} \neq s) \quad (5)$$

In Equation 5, the finite subset A represents the modulation alphabet from which are carved the information symbols. The minimization of the error probability under ML detection is equivalent to the minimization problem given by:

$$\hat{s} = \text{argmin}_{s_c \in A} \|y - Hs\|^2 \quad (6)$$

Assuming coherent system where H is perfectly known at the receiver (for example estimated using estimation techniques such as least square estimators), optimal ML detection may be solved for the closest vector in the n-dimensional lattice generated by H according to the minimization problem of Equation 6.

Thus the ML detector chooses the symbols vector s which yields the smallest Euclidean distance between the received vector y, and hypothesized message Hs. The ML detector represents a discrete optimization problem over candidate vectors s within the chosen constellation. In the case of higher constellations and higher dimension of the system (number of antennas), the search for the ML solution in an exhaustive way generally requires a very high complexity.

Sequential decoders implementing a tree search strategy searches the closest lattice point to the received vector using a decoding tree structure. Before transmission of the signal to such a sequential decoder, a predecoding may be performed using a QR decomposition of the channel matrix such that H=QR where Q designates the orthogonal matrix and R designates the upper triangular matrix. Given the orthogonality of Q, equation (4) can be rewritten in the following form:

$$\tilde{y} = Q^t y = Rs + Q^t w \tag{7},$$

The ML decoding problem then amounts to solving the equivalent system given by:

$$\hat{s} = \text{argmin}_{s_c \in \mathcal{A}} \|\tilde{y} - Rs\|^2 \tag{8},$$

The triangular structure of R thus reduces the search of the closest point to a sequential tree-search. Nodes in the tree represent the different possible values of the symbols $s_i$. The symbols $s_i$ for $i=1, \ldots, n$ represent the real and imaginary components of the transmitted information vector $s_c$. A tree branch represents two consecutive nodes $(s_{i+1}, s_i)$.

Referring now to FIG. 2, a flowchart is presented that depicts a stack reordering method which may be executed by the receiver 3, according to certain embodiments.

The sequential decoding of the received signal fills the stack by recursively expanding the child nodes for each top node selected in the stack (the decoding process starts with the root node of the tree as the top node), selecting a set of child nodes $s_k$ among the expanded child nodes, and adding the selected nodes in the stack, in association with their respective metrics $f^k(s_k)$ (and possibly with other node data) after the removal of the top node from the stack. The stack is then reordered by increasing order of the metrics of the nodes $s_k$, so that the node having the lowest metric is placed at the top of the stack (hence the bottom node of the stack corresponds to the node having the highest metrics). The process is repeated for the new top node in the stack until a leaf is reached. Accordingly, the node having the lowest metric is extended each time by its child nodes.

The reordering method may be applied during the sequential decoding one or more time in response to the verification of at least one stack reordering activation condition (step 200).

In response to the verification of a stack reordering activation condition (step 200), for at least some of the nodes stored in the stack, the metric $f^k(s_k)$ associated with the node is modified by subtracting the quantity $G_{s_k}$ from the metric $f^k(s_k)$ in step 201. In a particular embodiment, the reduction is applied to the metrics associated with all the nodes in the stack. The following description of certain embodiments of the invention will be made hereinafter with reference to a metric reduction applied to all the nodes of the stack.

The modified metrics $w_k(s_k)$ obtained after metric reduction in step 201 are given by:

$$w_k(s_k) = f^k(s_k) - G_{s_k} \tag{9}.$$

In step 203, the stack is then reordered in an increasing order of the newly modified metrics (the node with the lowest metric being positioned at the top).

In step 204, at least some of the nodes of the newly reordered stack are maintained (the other being removed).

As a result, the nodes with the highest levels (hence localized near to leaf nodes) are favored for the rest of the decoding. Hence, in the newly reordered stack the most advanced nodes in the tree are in the top part of the stack.

Each subsequent access to the stack during the ongoing decoding of the received signal will thus use the newly reordered stack.

In one embodiment, the quantity $G_{s_k}$ which is used to reduce the metric of the nodes in the stack may be a positive-value function g(k) of the current level k of the tree being processed (the level k is thus the level of the node $s_k$ being expanded).

The introduction of the positive-value function g(k) to reorder the nodes of the stack accordingly makes it possible for the decoding method to master the filling of the stack and adapt it to the required decoding complexity and convergence time.

In certain embodiments, only one iteration of the reordering steps 200-203 may be performed. Alternatively, several iterations of the reordering steps 200-203 may be performed so that the stack may be reordered several times during the decoding.

Even if not limited to such applications, the reordering method may be used for early termination of the decoding process. A termination of the decoding may be required for example in situations where the communication channel comprises deep fading so that a longer decoding process may be needed to provide optimal detection. A higher computational complexity may be thus needed while sometimes such complexity may not be available due to the limited hardware resources (arithmetic logic units, silicon area on integrated circuits, etc.). Hence, in such situations, optimal detection may need to be sacrificed for the sake of guaranteeing throughput using the available limited resources. As a result, the decoding method has to be finished prematurely and an emergent solution should be returned, according to a decoding termination process. In conventional approaches, such as the clipping approach which is only applicable to sphere decoders or Schnorr-Euchner (SE) decoders, the decoding method is terminated by stopping the decoding as soon as a termination alarm is triggered and returning the actual visited points inside the sphere as an output.

According to another existing termination approach adapted to sequential decoders but providing suboptimal performance, the termination is achieved using a ZF-DFE termination technique as proposed in A. Salah, Low complexity decoding schemes for MIMO systems, In PhD dissertation, 2010 (ZF-DFE stands for Zero-Forcing Decision Feedback Equalization). According to this ZF-DFE termination approach, when a termination constraint is satisfied, the decoding algorithm performs a ZF-DFE termination by visiting, at each tree level, only the best child of the current node in the top of the stack until a leaf node is reached.

Figure 3:
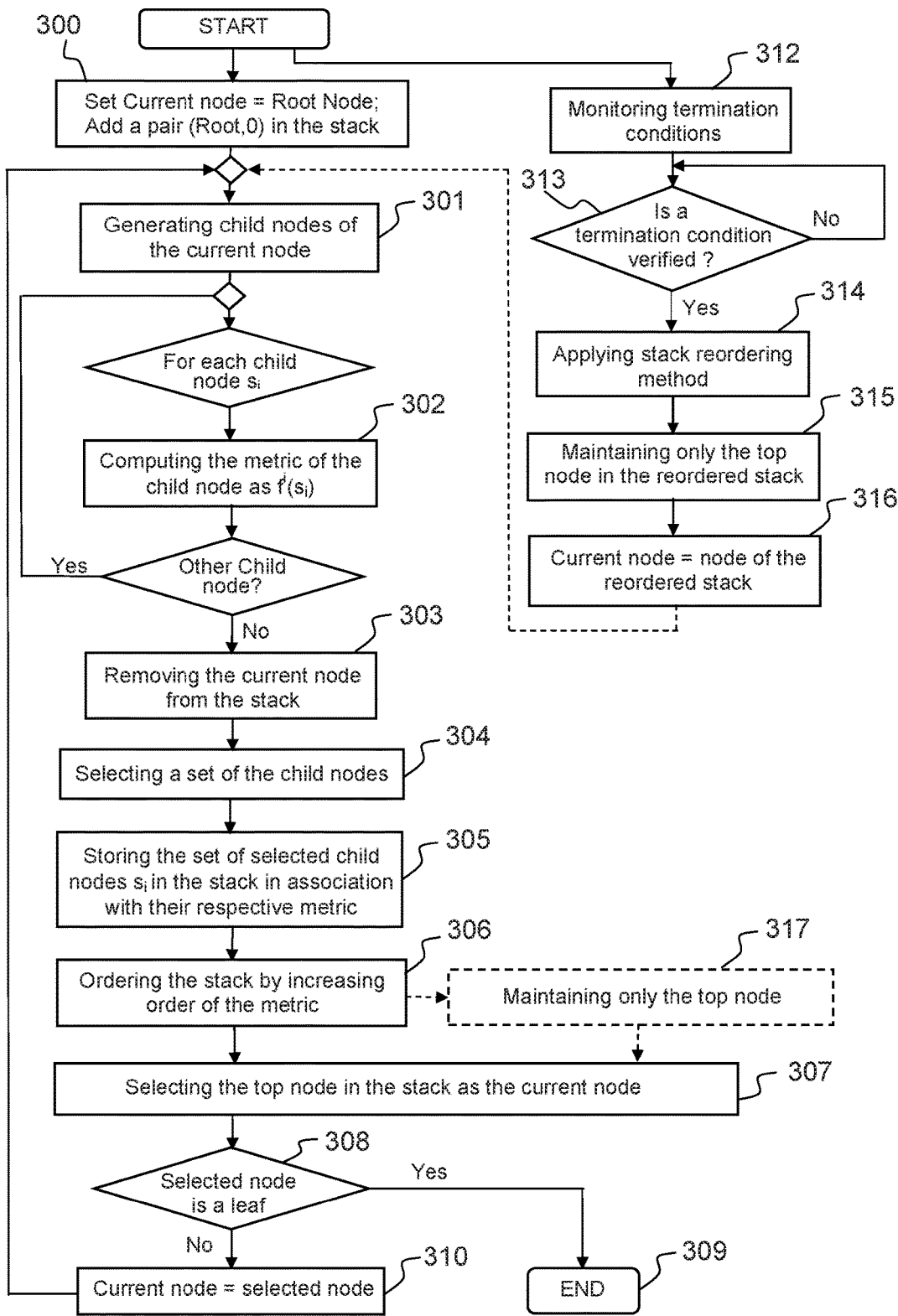
FIG. 3 is a flowchart depicting a sequential decoding method using stack reordering for early decoding termination according to certain embodiments.

An application of certain embodiments of the invention to early termination is illustrated in FIG. 3. FIG. 3 is a flowchart that depicts a sequential decoding method which may be executed by the receiver 3 which is adapted for early termination in response to the activation of a termination alarm.

The received data signal corresponds to a transmitted data signal transported by a transmission channel associated with a channel matrix H.

The search tree (also referred to as "the decoding tree" hereinafter) may be generated through a QR decomposition of the channel matrix H (H=QR) in a pre-decoding phase as described above, where $Q^t$ represents an orthogonal matrix and R represents the generator matrix in the decoding equivalent system, and through a multiplication of the received signal by $Q^t$. Given the upper triangular structure of the matrix R, the ML optimization problem is solved by performing a tree-search based on the generation of the decoding tree. An empty stack or list may be also initialized.

In step 300, the root node is selected as the current node and a pair (Root, 0) is added to the stack at the top position.

In step 301, the child nodes (or descendent nodes) of the root node representing all the possibilities of the first symbol $x_1$ are expanded. Specifically, for the current node being processed, all or a selected set of child nodes may be determined by projecting onto the i-th layer of the matrix R resulting from the QR decomposition.

For each child node expanded, in step 302, the metric of the child node is calculated from the Euclidean distance $f'(s_i)$ between the signals received and the path between the root node and the node considered.

When all the child nodes have been processed, in step 303, the node positioned at the top of the stack is removed from the stack. In the first iteration of steps 300 to 302, the top node is the root node.

In step 305, all the child nodes or a set of the child nodes (selected in step 304) are inserted in the stack. Each child node $s_i$ is added in the stack together with its respective metric determined from either $f'(s_i)$ in step 302. Additional data may be further inserted in the stack in association with each child node such as the path and/or the dimension of the child node.

In step 306, the nodes in the stack are arranged according to an increasing order of the metrics associated with nodes.

In step 307, the top node of the stack $s_{top}$ is selected as the current node in order to expand its child nodes.

In step 308, it is determined if the selected node is a leaf node. If the selected node is a leaf node (i.e. having no child node), the method is terminated in step 309. The decoder may then return an estimate of the symbols vector.

Otherwise, in step 310, the selected node is set as the current node and steps 300 to 310 may be repeated for the newly selected node (which represents the node having the lowest metric in the stack) to generate the child nodes, at a next level j of the decoding tree with j being comprised between n−1 to 1. The next processed level j depends on the top node selected in the stack.

Each iteration of steps 300 to 310 (corresponding to the processing of a current node) thus provides a path between the root node and a new leaf node stored in the stack.

The received signal may be estimated from the node information stored in the stack, and in particular the path(s) stored in the stack when such information is available. For example, if a symbol estimation (hard decision) is applied, the construction of the tree implements a single iteration of steps 300 to 310 enabling a single path to be determined corresponding to a hard estimation of the transmitted data signal. Alternatively, if a probabilistic estimation (soft decision) may be applied, the decoding method may deliver soft-output information in the form of Log-Likelihood Ratio (LLR) values. In this case, several iterations of steps 300 to 310 may be performed. Each iteration provides a different path from the root node to leaf nodes (representing a candidate lattice point). These different paths (representing candidate lattice points) may then be stored in an auxiliary stack together with their paths. A probabilistic estimation of the information signal can be determined based on these paths.

In parallel, the receiver 3 monitors at least one termination alarm (step 312). The termination alarms are configured to impose an early termination of the decoding process when a termination alarm is activated. The decoder may start the sequential decoding as described in relation with steps 300 to 310 but, in response to the triggering of a termination alarm, an early termination of the decoding may be implemented by reordering the stack in step, according to steps 200-203 of FIG. 2, so as to enable the termination of the decoding method while returning an estimation of the received signal. A termination alarm may be activated depending on a number of conditions such as a condition related to the computational complexity which represents the number of multiplicative operations C used in all the previous decoding steps, a condition related to the processing time, a condition related to the size of the stack, etc. For example, a termination alarm may be triggered if the computational complexity C reaches the prescribed threshold $C_{th}$ or a portion of the prescribed threshold.

If it is detected that a termination alarm has been activated (step 313), the stack is reordered to impose an early termination of the decoding. More specifically, if a termination alarm is detected (step 313), the stack is reordered in step 314 according to the reordering method described in relation with FIG. 2 (steps 200-203). More specifically, the metrics of the nodes in the stack are reduced by the metric reduction function so that the modified metrics $w_k(s_k)$ are given by equation (9):

$$w_k(s_k) = f'(s_k) - g(k)$$

The stack is then reordered by increasing values of the modified metrics $w_k(s_k)$ (with the lowest metric placed in the top of the stack) and the top node of the stack is removed.

Each access to the stack needed during the rest of the decoding method—such as for removing the top node in step 303, storing the nodes in step 305, or ordering the nodes in step 306, or selecting the top node in step 307—will be performed using the newly reordered stack. It should be noted that if the alarm is triggered while an access to the stack according to step 303, 304, 305 and 306 is being performed, the stack reordering may be only triggered when the operation of step 303, 304, 305 or 306 is completed.

In certain embodiments, the decoding process may proceed by maintaining only the lowest metric node in the stack for each iteration of steps 300 to 310 (ZF-DFE like termination).

This includes maintaining only the top node in the reordered stack while removing the other nodes from the reordered stack, in step 315. In step 316, the unique node of the newly reordered stack (top node corresponding to the lowest metric node) is then selected as the current node for the next iteration of the decoding method.

The decoding method then proceeds with an iteration of steps 300 to 310, for the newly selected node, but instead of storing all the child nodes in steps 304 to 306, only the lowest metric node is stored in the stack until a leaf node is reached. In the example of FIG. 2, a new step 317 marked in dotted lines is added to maintain only the lowest metric node in the stack.

The stack will thus only comprise one node at each subsequent iteration until the decoding is terminated.

The decoding method may use the same stack reordering function g( ), each time the reordering of the stack is activated, or may change the stack reordering function g( ) for the different calls to the stack reordering function to optimize the decoding.

The metric $f'(s_1)$ associated with a child node $(s_i)$ is determined in step 301 from the weight metrics of the nodes in the tree comprised in the path from the root node $s_n$ to the current node $s_i$.

The weight metric $w(s_j)$ of a node at a level j of the tree can be determined as the Euclidean distance between the $j^{th}$ component of the vector j representing the received signal and the vector $(s_n \ldots s_j)$ comprising the node values of the tree from the root node $s_n$ to the node $s_j$ at level j according to equation (10):

$$f(s^j) = w_j(s_j) = |\tilde{y}_j - \sum_{k=j}^{n} R_{jk} s_k|^2 \qquad (10)$$

The weight metric of equation (10) represents a metric for the branch $(s_{j+1}; s_j)$. Due to the triangular structure of matrix R, the search for candidate lattice points is started from the component $s_n$. It should be noted that the cumulated weight $w(s_j)$ of a node $s_j$ represents the metric of the path $s^{(j)}$ (sum of the weight metrics $w_j(s_j)$ of the nodes in the tree comprised in the path $s^{(j)}$ from the root node $s_n$ to the node $s_j$). It is therefore equal to the sum over all weights for different nodes forming the path according to: $w(s_j) = \sum_{k=j}^{n} w_k(s_k)$. Using this definition, the ML metric minimization of equation (8) is equivalent to search for the path in the tree having the least cumulated weight.

Based on the definition provided in Equation (10), the modified metrics determined by the stack reordering method are equal to:

$$w_k(s_k) = f^*(s_k) - g(k) = |\tilde{y}_k - \sum_{j=k}^{n} R_{kj} s_j|^2 - g(k) \qquad (11)$$

In certain embodiments, the metric reduction function $g(k)$ may be a linear function of the form:

$$g(k) = ak + \lambda \qquad (12)$$

In Equation (12), a designates the slope coefficient $\alpha$ while designates the $\lambda$ intercept coefficient.

Particularly, the function $g(k)$ may be a multiplicative function ($\lambda = 0$):

$$g(k) = ak \qquad (13)$$

In certain embodiments, the coefficient parameter $\alpha$ of the metric reduction function (equation 12 or 13) may be a positive real value. The value of the coefficient parameter $\alpha$ may be selected depending on the desired convergence time and/or complexity of the decoding method. In particular, it has been determined that the value of the coefficient parameter $\alpha$ is proportional to the convergence time speed and conversely proportional to the complexity of the decoding method. Accordingly, if a fast convergence time and a low complexity is required, a large value of the coefficient parameter $\alpha$ may be chosen.

The value of the coefficient parameter $\alpha$ may be selected to be SNR-dependent. In particular, the value of the coefficient parameter $\alpha$ may be defined from the additive channel noise-level, such as for example according to equation 14:

$$\alpha = \sigma^2 \log\left(\frac{4}{\pi \sigma^2}\right) \qquad (14)$$

In Equation (14), $\sigma^2$ designates the variance of the MIMO channel additive noise.

Alternatively, the metric reduction function $g(k)$ may be a polynomial function of k.

In another embodiment of the invention, the stack reordering steps may be used to manage the size of the stack. Indeed, in practical implementations of sequential decoders, the stack memorizing the visited nodes during the decoding process, is often of a fixed size due to limited hardware resources. Imposing a fixed size for all MIMO system configurations and constellation size may induce a sub-optimality in the decoding process, particularly in presence of poor channel realizations. It may occur that the number of the expanded nodes (generated in step 301) exceeds the size of the stack, while the stack size is constrained to K nodes. An existing solution to this problem is to configure the decoder so that only the top K nodes in the stack are always kept when the size is exceeded while the nodes with the highest metrics are eliminated. However, this method does not provide ML performance.

Figure 4:
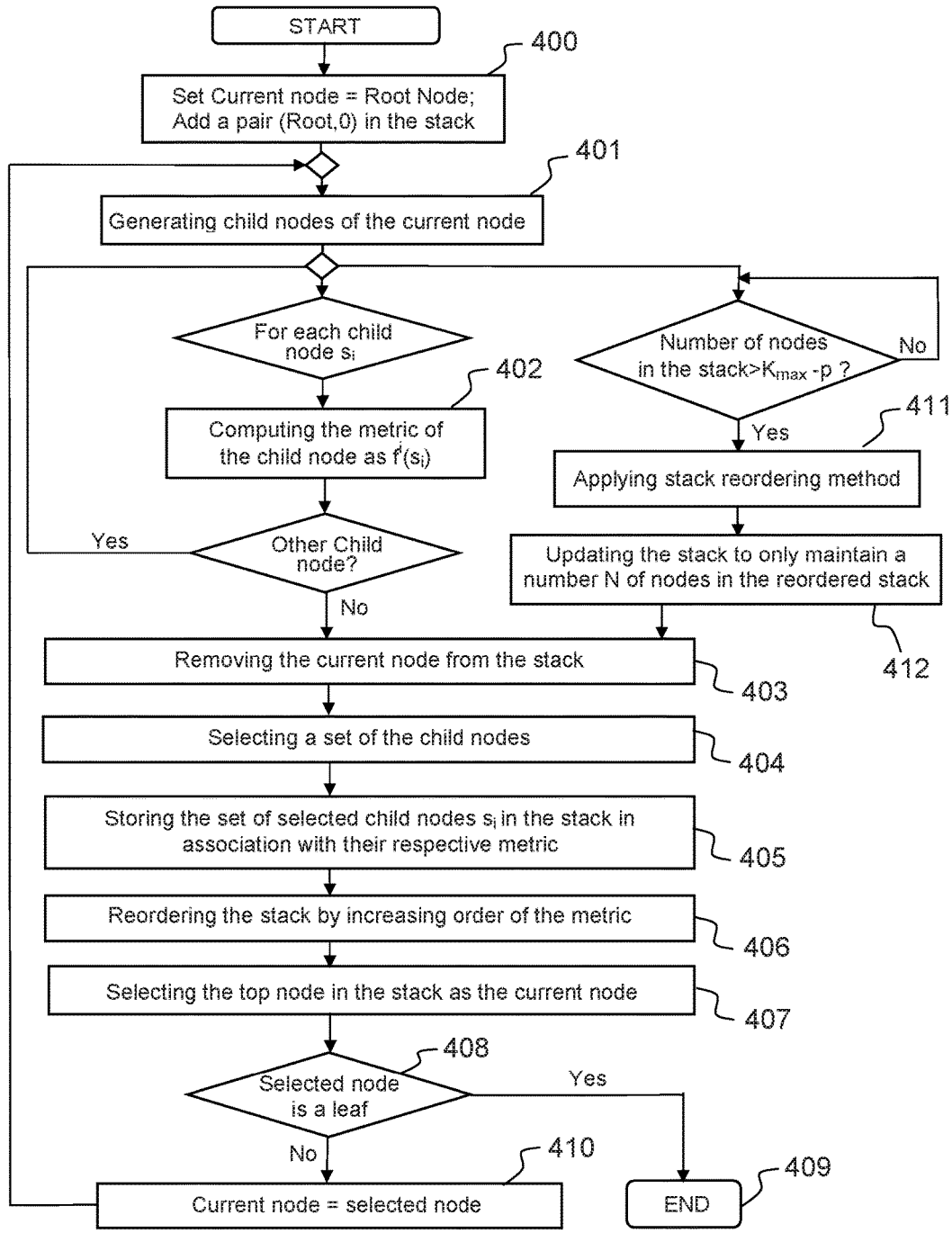
FIG. 4 is a flowchart depicting a sequential decoding method using stack reordering for monitoring the stack size according to certain embodiments.

FIG. 4 illustrates an exemplary application of the invention to stack size management using the stack reordering method according to certain embodiments. This application is described hereinafter in relation with a sequential decoder using an SB-Stack algorithm for illustrative purpose. Specifically, FIG. 4 shows a flowchart that depicts a sequential decoding method implementing stack size management and which may be executed by the receiver 3, according to certain embodiments.

The decoding of the received signal starts after the predecoding phase for generating the decoding tree through the QR decomposition of the channel matrix H (H=QR) as described in relation with FIG. 3.

Steps 400 to 410 are similar to steps 300 to 310. However, step 404 comprises selecting the set of child nodes in a sphere of radius $C_s$ (the sphere constraint is expressed in inequality ($\|\tilde{y} - Rs\|^2 \leq C_s^2$). This involves that only the nodes having a value that is comprised in the interval $I_i = [b_{inf,i}; b_{sup,i}]$ are visited, where $b_{inf,i}$ and $b_{sup,i}$ depend on the sphere radius are stored in the stack. An interval is determined for each node representing a component of a symbol of the signal to be decoded. Specifically, the search interval $I_i$ for each detected symbol $s_i$ such that $b_{inf,i} \leq s_i \leq b_{sup,i}$ may be defined by the following boundaries:

$$b_{inf,i} = \left\lceil -\sqrt{\frac{T_i}{p_{ii}}} + S_i \right\rceil \qquad (15)$$

$$b_{sup,i} = \left\lfloor \sqrt{\frac{T_i}{p_{ii}}} + S_i \right\rfloor \qquad (16)$$

Where:

$p_{ii} = R_{ii}^2$ with $i = 1, \ldots, n$ $p_{ij} = \dfrac{R_{ij}}{R_{ii}}$ with $j = i+1, \ldots, n$ $S_i = \rho_i + \sum_{j=i+1}^{n} p_{ij} \xi_j^2$ $T_i = C_s^2 - \sum_{l=i+1}^{n} p_{ll}\left(\xi_l + \sum_{j=l+1}^{n} p_{lj}\xi_j\right)^2 = T_{i-1} - p_{ii}(S_i - s_i)$ Each child node is thus selected in step 404 as a component of a candidate lattice point only if the node value of the child node is comprised in the search interval. Hence, the number of visited nodes during the decoding process depends then on the interval $I_i$ for each symbol $s_i$, the boundaries of the search interval depending on the sphere radius $C_s$.

In parallel, the receiver 3 monitors the filling of the stack with respect to the maximal size $K_{max}$ of the stack. The decoder may start the sequential decoding as described in relation with steps 400 to 410 and, in response to the size of the stack exceeding the quantity $K_{max}$-p (step 412), when extending a child node within the search space, with p designates a control parameter such that p is superior or equal to zero. In one embodiment, the control parameter p may be equal to zero. When the condition related to the maximal size $K_{max}$ of the stack is detected, the reordering method as described with relation to FIG. 2 (step 220-203)

is applied in step 413: the decoder introduces the metric reduction function g(k), recalculates the metrics for all the nodes in the stack such that for a node $s_k$ at level k its modified metric $w_k(s_k)$ is given by equation 9:

$$w_k(s_k) = f^k(s_k) - g(k) = |\tilde{y}_k - \Sigma_{j=k}^n R_{kj} s_j|^2 - g(k) \quad (9)$$

The modified stack is then reordered (step 203 of FIG. 2) by increasing value of the newly derived metrics $w_k(s_k)$.

In step 414, a part of the stack is freed by removing a selected or predetermined number of nodes located in the bottom of the reordered stack.

Steps 413 and 414 will be iterated each time the condition related to the size $K_{max}$ of the stack is detected (step 412). In certain embodiments, the parameter p may be fixed during the whole decoding process. Alternatively, the parameter p may be updated for each new iteration of steps 413 and 414.

Using the stack reordering method according to embodiments of the invention, the nodes the most advanced in the tree are favored and the stack is reordered such that the top nodes have the least metrics and are the nearest to the leaf nodes' level. After the step of selecting a set of top nodes and removing a number of exceeding nodes (414), the decoder may continue the tree search using the non-reduced computation of the weight metric $w_k(s_k) = f^k(s_k)$ (as determined in step 301). It should be noted that the number of nodes maintained in the stack may be selected statistically or dynamically or predetermined depending on various parameters.

The stack reordering method may be applied once or several times, according to steps 412-414, whenever the stack exceeds its size limit. The same or a different function g(k) may be selected for each application of the stack reordering method during the decoding of the received signal.

Even if not limited to such application, this embodiment is particularly suitable for stacks having a small size, the reordering steps allowing to obtain the best complexity/performance tradeoff.

Figure 5:
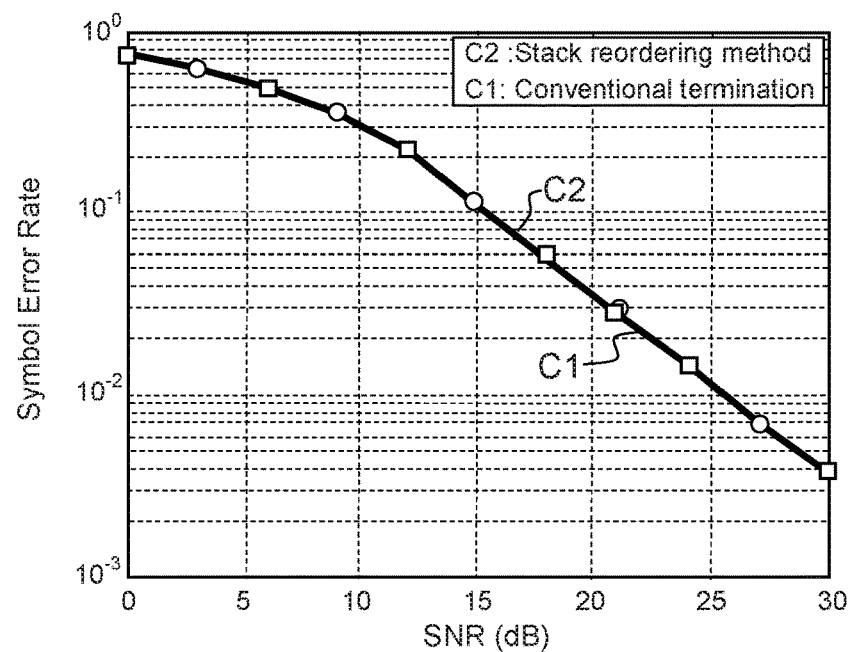
FIG. 5 is a diagram illustrating the Symbol Error Rate obtained with a decoder according to certain embodiments, in a 4×4 MIMO communication system, depending on the Signal-to-Noise Ratio (SNR)
Figure 6:
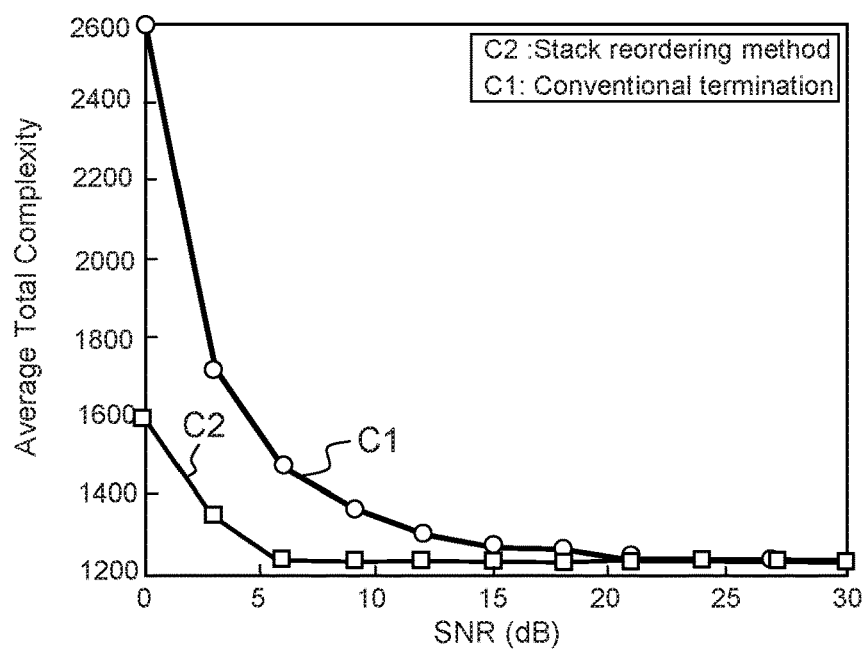
FIG. 6 is a diagram illustrating the average total complexity obtained with a decoder according to certain embodiments, in a 4×4 MIMO communication system, depending on the Signal-to-Noise Ratio (SNR)

FIGS. 5 and 6 respectively illustrate the Symbol Error Rate (SER) and the total computational, as a function of the SNR (dB), obtained with a simulation of the decoding method implementing the stack reordering method for early termination of the decoding, according to certain embodiments, in a 4×4 MIMO communication system ($n_t=4$ and $n_r=4$) using spatial multiplexing and 16-QAM modulation, and averaging over 105 channel realizations.

In FIGS. 5 and 6, two curves 50 and 52 are shown, curve 50 corresponding to a conventional ZF-DFE termination solution and Curve 52 corresponding to the early termination according to certain embodiments of the invention. Curve 52 in FIGS. 5 and 6 corresponds to a stack reordering method using a metric reduction function of multiplicative type g(k)=αk, with α=2.

When the termination alarm is triggered to notify that the decoding process is to be ended, the decoder recalculates the metrics of the stored nodes in the stack, reorders them and exits as the ZF-DFE termination mode, as described above in relation with FIG. 3. FIG. 5 which illustrates the error rate performance shows that although the reordering technique according to certain embodiments (curve 52) may introduce a sub-optimality in recalculating the metrics for the nodes, it provides the same error performance as the conventional ZF-DFE termination method without stack reordering (curve 50). FIG. 6 shows that a major advantage of the stack reordering method as applied to early termination is that it requires lower overall decoding complexity and thus faster convergence time than the conventional approach.

Figure 7:
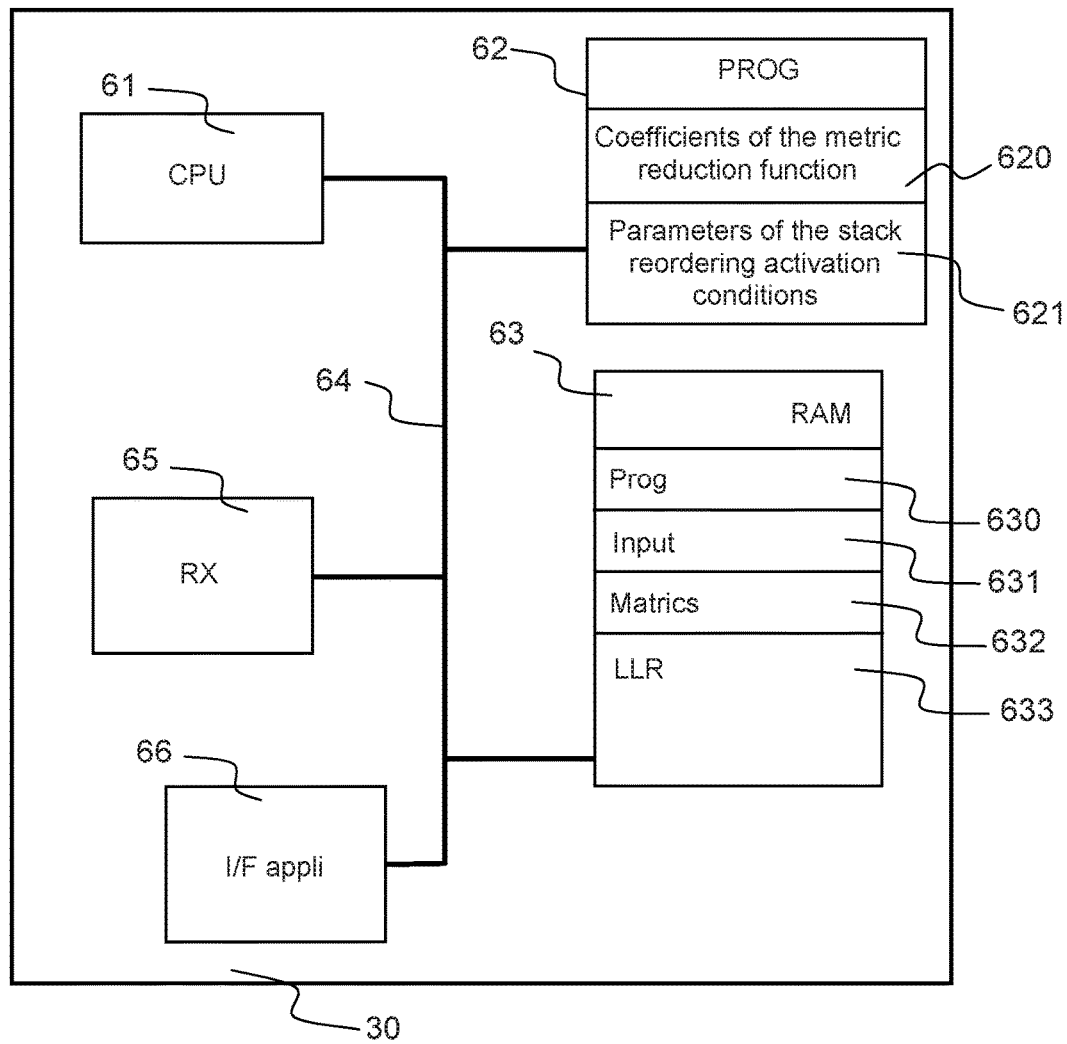
FIG. 7 schematically shows an exemplary hardware architecture of the decoder according to certain embodiments.

FIG. 7 represents an exemplary architecture of a space/time decoder 30 of the receiver 3 in a SB-stack embodiment of the invention. As shown, the space/time decoder 30 may include the following elements, which are linked together by a data and address bus 64:
- a microprocessor 61 (or CPU), which is, for example, a digital signal processor (DSP);
- a non-volatile memory 62 (or ROM, read-only memory);
- a random access memory RAM 63;
- an interface 65 for receiving input signals coming from the time/frequency converter;
- an interface 66 for transmitting decoded data to the demodulator 31.

The non-volatile ROM memory 62 may include for example:
- a register "Prog" 620;
- coefficients 621 of the metric reduction function g(k), when such coefficients are set deterministically (they may include for example the slope and or intercept coefficients α and λ when the function g(k) is of linear type or the polynomial coefficients when the function g(k) is of polynomial type); parameters related to the stack reordering activation conditions 622 such as:
 the maximal size of the stack $K_{max}$ and the control parameter p in the stack size management application of the invention and/or
 the thresholds related to the terminations alarms in the termination application of the invention.

The algorithms for implementing the method according to this embodiment of the invention can be stored in the program 620. The CPU processor 41 may be configured to download the program 620 to the RAM memory and runs the corresponding instructions. Specifically, the CPU comprises instructions for determining estimated symbols representative of the transmitted symbols carried by the received signal, the estimated symbols being determined by recursively expanding a current node of a decoding tree, the nodes of the tree corresponding to a possible component of a symbol of said received data signal, each node in the tree being associated with a respective metric, said current node corresponding to the node of a stack having the highest metric, and by storing at least some of the expanded nodes in said stack, each node being stored in the stack in association with its respective metric, and ordering the stack, after removal of the current node from the stack, by increasing value of the metric associated with each node in the stack.

The CPU further comprises instructions for monitoring at least one stack reordering activation condition, and in response to a stack reordering activation condition being verified, reducing the metric associated with each child node in the stack by a selected or predetermined quantity, reordering the stack by increasing value of the reduced metric, and maintaining at least some of the nodes of the reordered stack, the decoding proceeding with the stack thus reordered.

The RAM memory 63 may include:
- in a register Prog 630, the program run by the microprocessor 61 and downloaded in an active mode of the space/time decoder 30;
- input data in a register 631;
- data related to the nodes in a register 632;
- likelihood probabilities or LLR in a register 634;

The data stored in the register 632 may include, for a node of the decoding tree, metric parameters associated with this node (path from the root to said node, and/or the depth in the tree).

More generally, the decoding techniques described herein may be implemented by various means. For example, these techniques may be implemented in hardware, software, or a combination thereof. For a hardware implementation, the processing elements of decoder can be implemented for example according to a hardware-only configuration (for example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such detail. Particularly, the invention is not limited to a particular type of sequential decoder. More generally the invention may apply to any sequential decoder using a best-first tree-search to search for candidate lattice vectors such as Stack decoders, Fano decoders, decoders implementing the M-algorithm, the SB-Stack and the Zigzag Stack decoder as described in patent application EP No 14306517.5. The zigzag decoder uses a stack, similarly to the SB-stack decoder, but instead of searching the candidate lattice points in a sphere, the zigzag decoding algorithm generates, in step 301, at most three child nodes comprising a reference child node of the current node determined from the vector representing the received data signal, a first neighbor child node determined by subtracting a positive integer parameter from the value of the reference node, and a second neighbor child node determined by adding the positive integer parameter to the value of the reference child node. Child nodes are selected in step 304 among the three child nodes. The selected child node can then be stored in a stack similarly to the SB-stack decoder together with their respective metric, the stack being then reordered by increasing order of the node metrics. The top node of the stack, thus obtained, is selected as the new current node to iterate the recursive search operation.

Further, although the invention has been described in relation with certain examples of the metric reduction quantity $G_{s_k}$, and particularly with certain examples of such quantity where $Q_{s_k}$ as a function of the level k of the node $s_k$ in the tree ($G_{s_k}=g(k)$) for illustrative purpose, it should be understood that the invention is not limited to such examples.

Also, the invention in not limited to the early termination and stack management applications described above.

Further, the various embodiments of the invention are not limited to particular types of detection, and apply both to hard and soft detection.

Further, while some embodiments of the invention have been described in relation to wireless MIMO systems involving a single pair of transmitter/receiver, it should be noted that the invention is not limited to such an application. The invention may be integrated in any receiver device operating in any linear communication system characterized by a linear representation of the channel output. The communication system may be wired, wireless or optical fiber-based accommodating single or multiple users, using single or multiple antennas, and single or multi-carrier communication techniques. For example, the present invention may be integrated in a receiver device implemented in a wireless distributed MIMO system. Distributed MIMO may be used for example in cellular communications applied in 3G, 4G, LTE, and future 5G standard. Cooperative communications applied for example in ad-hoc networks (wireless sensor networks, machine-to-machine communications, internet of things, etc) are also examples of distributed MIMO systems.

In addition to wireless networks, the present invention may be integrated in optical receiver devices implemented in optical fiber-based communication systems such as Polarization Division Multiplexing-OFDM (PDM-OFDM) systems.

Further, the invention is not limited to communication devices and may be integrated in signal processing devices such as electronic filters of finite impulse response (FIR) used in audio applications like audio crossovers and audio mastering. Accordingly, some embodiments may be used to determine an estimate of an input sequence, given an output sequence of a FIR filter of order M.

In another application, methods, devices and computer program products according to some embodiments of the invention may be implemented in a Global Navigation Satellite System (GNSS), such as IRNSS, Beidou, GLONASS, Galileo; GPS comprising for instance at least a GPS receiver for estimating positioning parameters using for example carrier phase measurements.

Further, methods, devices and computer program products according to some embodiments of the invention may be implemented in cryptographic systems for determining estimates on private secret values used in a cryptographic algorithm for encrypting/decrypting data or messages during their storage, processing or communication. In lattice-based cryptography applications, data/messages are encrypted in the form of lattice points. The decryption of such encrypted data may be advantageously performed according to some embodiments of the invention, enabling for a high probability of success recovery of secret values with a reduced complexity.

The invention claimed is:

1. A decoder for sequentially decoding a data signal received through a transmission channel in a communication system, said received data signal carrying transmitted symbols, said decoder comprising:
   at least one memory, and
   one or more processors configured to:
      determine estimated symbols representative of the transmitted symbols carried by the received signal from information stored in a stack, the stack being filled by iteratively expanding child nodes of a selected node of a decoding tree comprising a plurality of nodes, each node of the decoding tree corresponding to a candidate component of a symbol of said received data signal and each node being associated with a predetermined metric, the stack being filled at each iteration with at least some of the expanded child nodes and being ordered by increasing values of the metrics associated with the nodes, the selected node for each iteration corresponding to the node having the lowest metric in the stack,
      monitor at least one stack reordering activation condition and, in response to a stack reordering activation condition being verified, to:
      reduce the metric associated with each node stored in the stack by a quantity,
      reorder the stack by increasing value of the reduced metric, and
      remove a set of nodes from the reordered stack so as to maintain a number of nodes in the reordered stack, the maintained nodes corresponding to the nodes having the lowest metrics in the reordered stack.

2. The decoder of claim 1, wherein the one or more processors are further configured to order and reorder the stack by placing the node having the lowest metric at the top of said stack, and wherein the nodes removed from the stack correspond to the nodes located in the bottom part of the reordered stack and the nodes being maintained in the reordered stack correspond to said number of nodes located in the top part of the reordered stack.

3. The decoder of claim 1, wherein the one or more processors are further configured to determine the metric associated with a given node of the decoding tree as a function of the Euclidean distance between the signal received and the path between the root node of the decoding tree and said node.

4. The decoder of claim 1, wherein said at least one stack reordering activation condition comprises a termination condition for triggering an early termination of the decoding.

5. The decoder of claim 4, wherein said termination condition comprises one condition related to the current computational complexity of the decoding.

6. The decoder of claim 4, wherein the one or more processors are further configured to only maintain one node corresponding to the node having the lowest metric in the reordered stack.

7. The decoder of claim 6, wherein, in response to the reordering of the stack, the one or more processors are further configured to only store in the stack one node corresponding to the node among the expanded child nodes having the lowest respective metric, in each subsequent iteration.

8. The decoder of claim 1, wherein said at least one stack reordering activation condition comprises a stack size related condition related to the number of nodes stored in the stack with respect to the maximal size of the stack.

9. The decoder of claim 8, wherein said stack size related condition is verified if the number of nodes stored in the stack exceeds a quantity equal to the difference between the maximal size ($K_{max}$) of the stack and a predefined positive valued parameter (p).

10. The decoder of claim 8, wherein said number of nodes maintained in the reordered stack is a function of the difference between the maximal size ($K_{max}$) of the stack and said predefined positive valued parameter (p).

11. The decoder of claim 1, wherein the quantity ($G_{s_k}$) applied to reduce a metric associated with a given node stored in the stack is a function (g(k)) of the level (k) of the node ($s_k$) in the decoding tree.

12. The decoder of claim 11, wherein said function (g(k)) applied to a metric associated with a given node stored in the stack is a polynomial function of the level (k) of the node ($s_k$) in the decoding tree.

13. The decoder of claim 11, wherein said function (g(k)) applied to a metric associated with a given node stored in the stack is a linear function having predefined slope and intercept coefficients.

14. The decoder of claim 13, wherein the intercept coefficient is null and the slope coefficient is a positive valued coefficient determined from the noise level.

15. A receiver for receiving and decoding an encoded data signal, wherein the receiver comprises a decoder according to claim 1 for decoding said data signal.

16. A mobile device capable of transmitting and receiving data in a wireless communication network, wherein the mobile device comprises a receiver according to claim 15 for receiving a data signal.

17. A method of sequentially decoding a data signal received through a transmission channel in a communication system, said received data signal carrying transmitted symbols, said method comprising:

determining estimated symbols representative of the transmitted symbols carried by the received signal from information stored in a stack, the stack being filled by iteratively expanding the child nodes of a selected node of a decoding tree comprising a plurality of nodes, each node of the decoding tree corresponding to a candidate component of a symbol of said received data signal and each node being associated with a predetermined respective metric, the stack being filled at each iteration with at least some of the expanded child nodes and being ordered by increasing values of the metrics associated with the nodes, the selected node for each iteration corresponding to the node having the lowest metric in the stack, monitoring at least one stack reordering activation condition and, in response to a stack reordering activation condition being verified, to:

reduce the metric associated with each node stored in the stack by a quantity, reorder the stack by increasing value of the reduced metric, and remove a set of nodes from the reordered stack so as to maintain a number of nodes in the reordered stack, the maintained nodes corresponding to the nodes having the lowest metrics in the reordered stack.

18. A computer program product for sequentially decoding a data signal received through a transmission channel in a communication system, said received data signal carrying transmitted symbols, said estimated symbols being determined from nodes of a decoding tree based on a weight metric associated with each of said node, wherein the computer program product comprising:

a non-transitory computer readable storage medium; and instructions stored on the non-transitory computer readable storage medium that, when executed by a processor, cause the processor to:

determine estimated symbols representative of the transmitted symbols carried by the received signal from information stored in a stack, the stack being filled by iteratively expanding the child nodes of a selected node of a decoding tree comprising a plurality of nodes, each node of the decoding tree corresponding to a candidate component of a symbol of said received data signal and each node being associated with a predetermined respective metric, the stack being filled at each iteration with at least some of the expanded child nodes and being ordered by increasing values of the metrics associated with the nodes, the selected node for each iteration corresponding to the node having the lowest metric in the stack, monitor at least one stack reordering activation condition and, in response to a stack reordering activation condition being verified, to:

reduce the metric associated with each node stored in the stack by a quantity, reorder the stack by increasing value of the reduced metric, and remove a set of nodes from the reordered stack so as to maintain a number of nodes in the reordered stack, the maintained nodes corresponding to the nodes having the lowest metrics in the reordered stack.

* * * * *